United States Patent
Barsumian et al.

(10) Patent No.: US 7,630,853 B2
(45) Date of Patent: Dec. 8, 2009

(54) NON-LINEAR JUNCTION BASED ELECTRONICS DETECTION

(75) Inventors: Bruce R. Barsumian, Cookville, TN (US); Thomas H. Jones, Cookville, TN (US)

(73) Assignee: Research Electronics International, LLC, Algood, TN (US)

( * ) Notice: Subject to any disclaimer, the term of this patent is extended or adjusted under 35 U.S.C. 154(b) by 95 days.

(21) Appl. No.: 11/782,636

(22) Filed: Jul. 25, 2007

(65) Prior Publication Data
US 2009/0030622 A1  Jan. 29, 2009

(51) Int. Cl.
*G01R 27/28* (2006.01)
(52) U.S. Cl. .................................. 702/117; 324/535
(58) Field of Classification Search ................. 702/117, 702/118, 176, 177, 182–185, 188, 189
See application file for complete search history.

(56) References Cited

U.S. PATENT DOCUMENTS 5,994,905 A * 11/1999 Franchville ................. 324/533

* cited by examiner

*Primary Examiner*—Edward Raymond
(74) *Attorney, Agent, or Firm*—Hornkohl Intellectual Property Law, PLLC; Jason L. Hornkohl

(57) ABSTRACT

Line anomalies on a line under test are detected by generating a test signal at a first power level and coupling the test signal to the line under test. A response level is received from the line under test at a second and third harmonic frequency of the first test signal. A second test signal is generated at an increased power level and coupled to the line under test and a response level from the line is received at a second and third harmonic frequency of the second test signal. The process is repeated by raising the power level of the test signal until a current level supplied to the line by a test signal exceeds an acceptable threshold level. The response levels are compared to stored data to locate any line anomalies present. The stored data represents harmonic response data obtained from the same line at a previous time. A graphical or mathematical representation of the response data is produced such that the response data can be easily compared to locate any anomalies.

22 Claims, 3 Drawing Sheets

NON-LINEAR JUNCTION BASED ELECTRONICS DETECTION

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO SEQUENCE LISTING OR COMPUTER PROGRAM LISTING APPENDIX

Not Applicable

FIELD OF THE INVENTION

The present invention is directly generally toward the use of non-linear junction detection technology to detect the presence of surreptitious electronic surveillance devices connected to communication wiring. More particularly, an embodiment of the present invention is directed toward a non-linear junction detector that can detect abnormal electronic couplings to a line known to have existing electronics coupled to the line.

BACKGROUND OF THE INVENTION

Non-linear junction detector technology has previously been used to detect the presence of electronics connected to communication lines. The biggest limitation in previous non-linear junction detection methodologies is that the non-linear junction detection process was used only in a pass/fail capacity on lines that were believed to be completed isolated from electronic circuitry. Accordingly, prior art approaches were only able to determine if any electronics were present or coupled to a line under test if the line under test were disconnected from any normal and expected communication circuitry. For example, in order to detect concealed surveillance devices, technicians had to isolate a telephone line being tested from the local switch and from any attached phone sets or other electronic equipment to ensure that no known electronics were attached to the line. Unfortunately, disconnecting or removing all of the known electronics from a line being tested may be overly time consuming or difficult. Therefore, what is needed is a new and improved method and device for detecting electronics using non-linear junction detection while the line may still be connected to some communication equipment.

BRIEF SUMMARY OF THE INVENTION

An embodiment of the present invention is directed toward a method for detecting line anomalies on a line under test. In accordance with the method, a first test signal is generated at a first power level and the first test signal is coupled to the line under test. A response level is received from the line under test at a harmonic frequency of the first test signal. A second test signal is generated at a second power level and the second test signal is coupled to the line under test. A response level is received from the line under test at a harmonic frequency of the second test signal. The response levels are preferably at the second and third harmonic frequencies of the test signal. The first and second response levels are compared to stored data to locate the line anomalies. The stored data preferably represents harmonic response data from a line having a configuration similar to the line under test. Length differences in lines are compensated from when comparing response levels for different length cables. If the line under test is a wire pair in a multiple wire pair cable, the response levels are preferably compared to response levels from pairs within the multiple wire pair cable to locate the line anomalies. Also, the response levels for a selected line pair in one cable may also be compared to a corresponding pair in a different cable. The response levels are further compared to response levels obtained for the line under test at a different time to identify line configuration changes that occur over time. Graphical representations of the response levels are generated to aid in comparisons. A mathematical analysis of the graphical representation is performed to generate mathematical equations corresponding to the graphical representation that allows a mathematical comparison between the response levels and the stored data to be made.

Another embodiment of the present invention is directed toward a method of locating line response anomalies. In accordance with the method, a series of two or more test signals of increasing power are applied to a line being tested. The power of the test signals is increased until the AC line current supplied to the line by a test signal exceeds a current threshold. A line response to each of the test signals is measured at a harmonic frequency of the test signals. Line response data is created based upon the line's response to the test signals. The line response data is examined to locate line response anomalies by comparing the line response data to line response data from a similarly classified line. The line response data is also compared to line response data collected for the line at a previous time to detect changes in the line's configuration.

Yet another embodiment of the present invention is directed toward a device having circuitry and software for detecting line anomalies. The device includes a signal generator for producing a test signal having a selected frequency content and power level. A coupler couples the test signals to a line being tested. Bias circuitry generates a bias voltage that is applied to the line being tested. A receiver receives a line response to a test signal coupled to the line under test at a harmonic frequency of the test signal and produces line response data. A memory stores the line response data. A controller instructs the signal generator to generate signals having at least two different power levels and the received to store line response data at each power level. A display displays a graphical representation of the line response data such that the line anomalies can be manually identified. Software automatically mathematically compares the line response data to further aid in analysis.

DETAILED DESCRIPTION OF THE INVENTION

The present invention is directed toward an improved process for detecting taps, wiring, or electronics that may be coupled to a conductive line. The process can be applied to any type of wiring that is carrying information such as data lines, LAN lines, telephone lines, etc. In addition, the process can be applied to either making analog or digital communication systems. The present invention is particularly advantageous over the prior art with respect to analyzing a system that has an internal phone switch with supports many lines. The method does not require that the lines being tested be isolated from wiring or other expected electronics such as the internal phone switch which may be present. This represents a substantial improvement upon the prior art in that it saves an operator a tremendous amount of time to not have to search out the other end of the wire to ensure that it is not connected to any electronics. This is particularly beneficial in the field during a sweep, in that a sweep technician often does not have ready access to the other end of the line.

Figure 1:
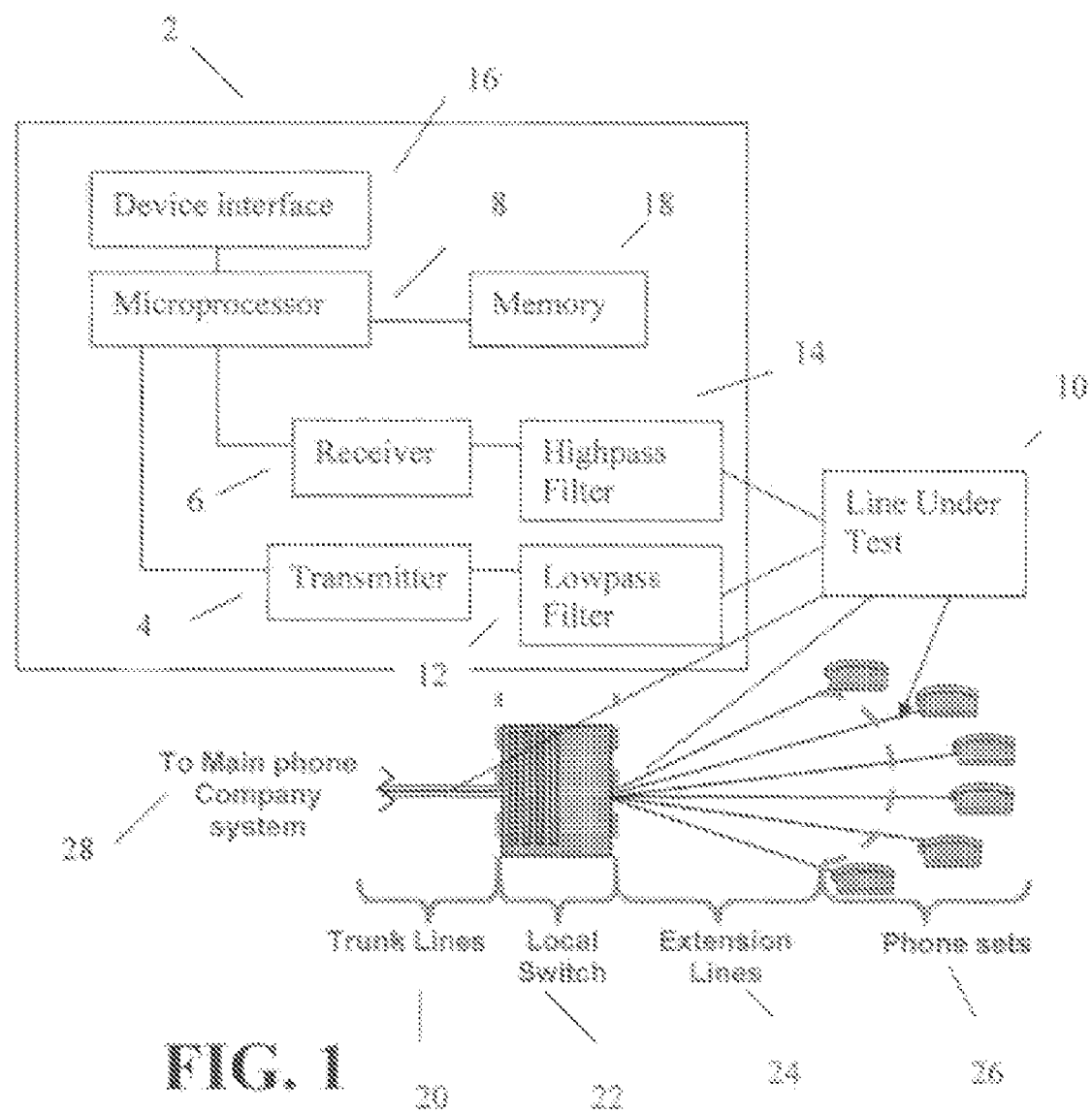
FIG. 1 is a block diagram of a device for detecting electronics coupled to a line in accordance with an embodiment of the present invention.

Referring now to FIG. 1, a clock diagram of an embodiment of the present invention coupled to a common telephone system is shown. The present invention utilizes non-linear junction detection (NLJD) technology to detect the presence of electronics. Non-linear junctions are present in dissimilar or corrosive metal junctions. In addition, non-linear junctions are also present in semiconductor electronic components. When subjected to an electronic signal or electromagnetic radiation at a given frequency, a non-linear junction will re-radiate harmonic signals at whole integer multiples of the frequency of the original electrical signal that was applied to the non-linear junction. For example, if a non-linear junction is radiated with a signal having a frequency of 100 kHz, the non-linear junction will re-radiate signals having frequencies of 200 kHz, 300 kHz, 400 kHz, etc. The 200 kHz frequency is known as, and referred to herein as, the second harmonic, and the 300 kHz frequency is known as the third harmonic.

Interestingly, non-linear junctions such as those found in corrosive or dissimilar metal junctions tend to re-radiate much higher amplitude third harmonic signals than second harmonic signals. However, semiconductor based non-linear junctions, such as found in all types of modern electronics, tend to radiate much stronger second harmonics than third harmonics. In addition, semiconductor based non-linear junctions have a response that varies more depending upon the level of DC bias voltage on a line that do non-linear junctions created by corrosive or dissimilar metal junctions. However, many telephone tap circuits utilize two diodes in reverse polarity as a limiting circuit. This type of circuit will result in a stronger third harmonic. Thus, the amplitudes of the harmonics signals re-radiated by a non-linear junction as indication of the type of non-linear junction re-radiating the harmonics.

A non-linear junction detector 2 constructed in accordance with an embodiment of the present invention includes a transmitter 4 and receiver 6 controlled by a microprocessor 8. The transmitter 4 includes a signal generator that is capable of generating a non-linear junction detection signal and is coupled to the line under test 10 through a low pass filter 12. The transmitter 4 preferably switches between two fundamental transmit frequencies in order for the frequency of the second and third harmonics to equal the same receive frequency such that both harmonics can be received by the same receiver 6. The low pass filter 12 block s the receiver 6 from detecting any harmonics produced by the transmitter 4 and only allows harmonics re-radiated from impedance anomalies on the line under test 10 to reach the receiver 6. The line's response to the transmitted signal is filtered through a high pass filter 14. The receiver 6 signal is digitized and subjected to harmonic analysis by the microprocessor 8. The processed results of the NLJD operation are than stored in memory 18 and displayed on the device interface 16 as described in more detail herein.

The transmitter 6 can include DC bias voltage circuitry to enhance the detection capabilities of the non-linear junction based detection processes. As briefly discussed above, applying a DC bias voltage increases a semiconductor based non-linear junction's response to a test signal. In addition, the response of the semiconductor based non-linear junction varies depending upon the characteristics of the DC bias voltage to which the junction is exposed. Thus, by coupling a variety of different DC bias voltages to the line under test 10, the presence of semiconductor based non-linear junctions can be detected by their changing responses to the test signal. The DC bias voltage is preferably varied in amplitude or polarity to detect changes in the non-linear junction's response that are indicative of whether or not semi-conductor based non-linear junctions are present. This is particularly useful in determining if any detected couplings are indicative of a concealed surveillance device.

The detector 2 can be used to detect a concealed surveillance device on a common telephone system as shown in FIG. 1. Trunk lines 20 connect the switch 22 of the system to the main telephone system. Extension lines 24 connect the switch 22 to a plurality of handsets 26. The switch 22 controls connections between the trunk lines 20 and extension lines 24. Commonly used switches are Private Branch Exchanges (PBX), Automated Call Distributors (ACD) and Key Switched Units (KSU). A non-linear junction detection process performed in accordance with an embodiment of the present invention can be initiated from at least three different points on the network shown in FIG. 1, (1) At the local switch 22 looking back at the trunk lines 20 toward the phone company 28; (2) at the local switch 22 looking at the extension lines 24; and (3) at the phone handsets 26 looking back at the local switch 22. Those skilled in the art will recognize that the particular connection point used to analyze the network will depend upon the particular network being analyzed and the access to the network afforded top the test technician. Fortunately, the process described with respect to FIG. 1 can be performed on a dry line that is isolated and not connected to any electronics or on a live line having a variety of electronics connected to the line.

To test the system of FIG. 1, a very pure RF transmit signal is preferably induced on one of the lines 20 or 26. The test is started either at the switch 22 or at the phone sets 26 as discussed above. The line under test, represented by block 10 in FIG. 1, is disconnected from any local electronics. For example, if the test is performed at a telephone set 26, the phone set 26 is first unplugged. If the test is performed at the switch 22, the line being tested is unplugged from the switch 22 prior to the test. This insures that an extremely large response non-linear junction response is not received from the electronics of the switch 22 or telephone set 26 which are in close proximity to the test location. Preferably, a low transmit frequency of a few hundred kHz is used for the non-linear junction detection signal produced by the transmitter 6. A relatively low frequency is used because as the transmit frequency is increased, the line being tested tends to have a low pass filter effect on the test signal. Thus, a higher frequency transmit signal will not have as great of a detection range and will not work as well when detecting taps that are relatively far away from the test access point. As discussed above, high quality low pass 12 and high pass 14 filters improve the performance of the system. A low pass filter 12 for the transmitter 4 ensures that there are no harmonics in the transmitted signal. A good high pass filter 14 is used on the receiver 6 input to ensure that the transmitted signal does not propagate into the system and generate false harmonics in the transmitted signal itself. For these reasons, the transmit signal's frequency is preferably selected based upon a compromise between implementing good filtering on the receiver while keeping the transmit frequency low enough for the signal to propagate down the line.

The embodiment shown in FIG. 1 measures the 2nd and 3rd harmonic strengths by utilizing a single frequency receiver 6 and a dual frequency transmitter 4. For the system shown, the receiver 6 operates at a frequency of 455 kHz, while the transmitter 4 operates at a frequency of 227.5 kHz to measure the line's 2nd harmonic response and at a frequency of 151.7 kHz to measure the line's 3rd harmonic response. Alternatively, a fixed frequency transmitter 4 can be used in connection with a two frequency receiver 6 to measure the 2nd and 3rd harmonic responses of the line 1. The present invention alters the transmit power of the transmitter 4 in a series of steps and measures the line under test's 10 response to the transmitted signals to produce a line signature. The transmitted signal's power is preferably ramped from a very low power to a higher power in at least 2 or more steps to obtain the best results.

Previously, it was considered dangerous to increase the power of a non-linear junction detection signal on an active pair of wires or wires having electronics coupled thereto due to the potential of damaging the electronics with the detection signal. In particular, with regard to telecommunications systems, it has been considered potentially dangerous to use a non-linear junction detection process on an active wire pair, or any wire pair 20 or 24 connected to a phone switch 22, for fear of damaging the switch 22. However, an embodiment of the present invention preferably senses the AC current on the line under test 10 for each transmitted power level. This measuring of the AC line current is done to ensure that the transmitter is not delivering too much power to, and thus potentially damaging, any electronics 22 and 26 existing on the line under test 10. If the measured current on the line exceeds a predetermined threshold, the ramping up of the power signal is immediately terminated to reduce the chance that any attached electronics, such as the switch 22 or the phone sets 26 will be damaged.

Once a line signature has been created for a particular pair of transmission wires, the line signature is saved in memory 18 and a similar test procedure is performed on another wire pair in the system. These measurements are preferably performed on all wire pair combinations in the lines 20 and 24. It should be noted that an eight conductor line will have 4 normal pairs of wires, but there are 28 possible combinations of pairs (1:2, 1:3, 1:4, 1:5, 1:6, 1:7, 1:8, 2:3, 2:4, 2:5, 2:6, 2:7, 2:8, 3:4, 3:5, 3:6, 3:7, 3:8, 4:5, 4:6, 4:7, 4:8, 5:6, 5:7, 5:8, 6:7, 6:8, 7:8). Surveillance devices can certainly be configured to use an odd or unusual combination of wore pairs so a through and complete scan of a system preferably tests all possible wire pair combinations. However, a good scan will simply cover the main default four wire pairs in a common eight conductor transmission line. Such a limited scan will still produce good results due to the fact that, even if an odd combination of pairs is used by a surveillance device, there will still be a noticeable alteration in the line's response for any pair combination that contains one of the conductors used by the tap. However, if a user tests a pair that contains both conductors used by the tap, the effects of the tap on the test results will be even further enhanced.

The present invention is beneficial in that it allows non-linear junction detection measurements to be performed on a telephone line 24, or any other type of low voltage line 20, that is still be attached to a phone switch 22 or other low voltage data system such as a LAN. Alternatively, if the procedure is performed at the local switch 22, the line 24 may be disconnected from the switch 22 but the phone sets 26 left attached to the other end of the line 24. This represents a significant shift away from the prevailing view of the non-linear junction detection theory. Previously, non-linear junction detection data has been used to determine if electronics exist or do not exist in a pass/fail type scenario. However, in accordance with embodiments of the present invention, a graphic is preferably provided that indicates if any concealed or unexpected electronics exist based on a consistent response from pair to pair. Thus, the present invention anticipates that electronics exist on the line under test, often even on non-active pairs. However, differences in the electronic response of similarly situated lines from one pair to the next or from one phone to the next may be indicative of a concealed electronic device since similarly configured lines should produce similar responses and line signatures.

Several types of comparisons can be made to help determine if a concealed electronic device is attached to a line. For example, comparisons may be made between pairs within the same cable. In addition, comparisons can be made between the same wire pair combination in different cable associated with different phones or phone jacks. Any pair exhibiting an irregular response is a candidate for further inspection to determine the source of the irregularity. Comparisons can also be made between the line signatures of a given pair within the same cable taken at different measurement times. This allows a technician to determine if unexpected changes in the line's response have occurred over time that may be indicative of a new connection to the line. This capability can be automated so that measurements are routinely acquired by a computer that statistically compares the newly acquired data to logged data to determine is an unusual change has occurred that may be indicative of an additional connection to the line. Also, when considering line combinations, it is important to note that since the transmit test signal is preferably a radio frequency signal; it will couple to other conductors adjacent to the wire pair under test. Therefore, any comparison or analysis must take into considerations that a pair comparison may indicate a change that is actually due to a change in an adjacent pair. Therefore, the comparison should consider the response from all pair combinations in order to find the pair combination that has the largest response difference.

At each transmit power level, the 2nd and 3rd harmonica levels are preferably measured. Therefore, each wire pair has data points associated with the 2nd and 3rd received harmonic levels at each transmit power level. It is again noted that these types of measurements may also be taken by applying bias voltage levels in the line for wire pairs that may be terminated at the switch, but are not active and have no voltage level imposed by the switch to enhance the detection sensitivity. Different bias voltages may be required when performing the test from different locations such as the phone side or switch side of a telephone system such that the bias voltage will not damage the electronics or interfere with a preexisting bias voltage on the line. For example, when testing from the phone side of the circuit, the switch may already be supplying a power voltage to the line and the application of a contradictory bias voltage may result in large currents being applied to the line and switch. However, when testing from the switch side with the switch disconnected there will be no bias voltage on the line and adding one will improve the sensitivity of the detector. Furthermore, in an alternate embodiment, a slowly varying AC bias may be supplied to line to invoke an increased response to some types of tap circuits. One example of this AC bias would be to vary the bias voltage between −80 volts and +80 volts at a frequency between 1 Hertz and 500 Hertz. Furthermore, this AC bias may be implemented with a variety of waveforms including but not limited to sine waves, square waves, ramped waveforms, saw tooth waveforms, and triangular waveforms. The benefit of this type of waveform is to penetrate some types of filtering that may be utilized in a sophisticated tap device. After data points have been collected from the harmonic signal level responses, the data points are preferably graphed such that a visual comparison of the graphs may be made by a user. For certain types of electronic taps, there may be certain definitive curve variations in the electronic responses in the line response due to taps and/or normal existing electronics. These curve shapes represent the non-linear junction detection signature of the wore pair. Variations in signatures tend to represent variations in electronic content connected to the line. Libraries of line responses for various know line configurations and electronics may be created to aid in the detection and identification process.

Figure 2:
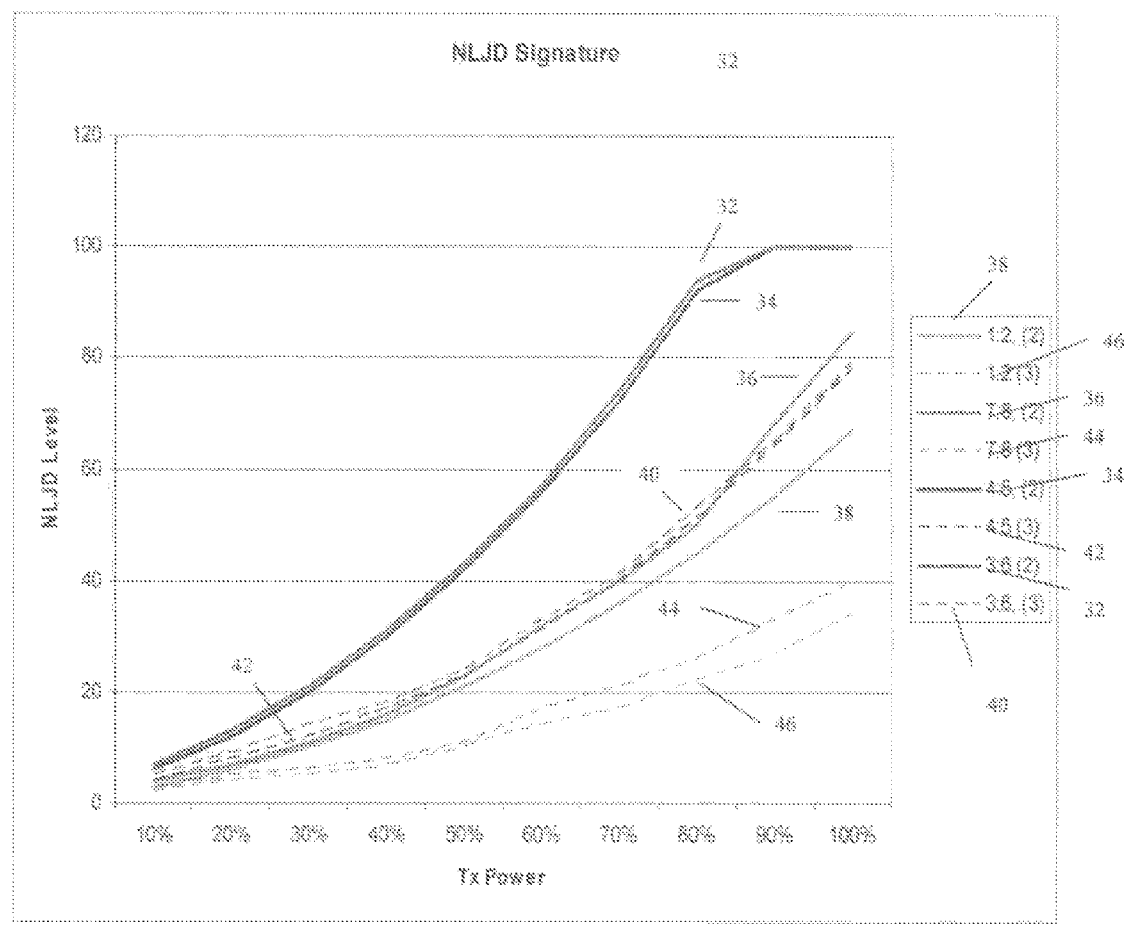
FIG. 2 is a graphical illustration of four sets of 2nd and 3rd harmonic line signatures for the four normal pairs of wires in an eight wire cable produced in accordance with an embodiment of the present invention.

Referring now to FIG. 2, a graph of the 2nd and 3rd harmonic line signatures 32-46 for an eight wire cable is shown. In an actual graph displayed on the display of a test drive, the line signatures 32-46 are preferably identified through color codes. Most preferably, the 2nd harmonic line signatures 32-38 are shown in solid lines while the 3rd harmonic line signatures 40-46 use the same color line, dashed, to indicate that it is the 3rd harmonic signature of the corresponding wire pair. The user can also preferably select between viewing only the 2nd or 3rd harmonics line signatures on both the graphic display of the device to help identify semiconductor based electronics.

In FIG. 2, line 32 represents the 2nd harmonic line signature for wire pair 1:2 and line 40 represents the 3rd harmonic line signature for pair 1:2. Line 34 represents the 2nd harmonic line signature for wire pair 3:4 and line 42 represents the 3rd harmonic line signature for pair 3:4. Line 36 represents the 2nd harmonic line signature for wire pair 5:6 and line 44 represents the 3rd harmonic line signature for pair 5:6. Line 38 represents the 2nd harmonic line signature for wire pair 7:8 and line 46 represents the 3rd harmonic line signature for the pair 7:8. All wire pairs produce some type of electronic signature. A user can examine the line signatures to determine if any similarly situated pairs (i.e. active pairs or inactive pairs), have dramatically different line signatures. In FIG. 2, it is not that surprising that the 2nd harmonic line signatures 32 and 34 of pairs 4:5 and 3:6 are relatively high because they both represent active pairs and both have very similar line signatures 32 and 34. However, pairs 1:2 and 7:8 are both inactive, but pair 7:8 has a dramatically higher 2nd harmonic line signature 36 than the line signature 38 of pair 1:2. The strongly suggests that unexpected electronics or conductors are coupled to pair 7:8. In practice, a user will quickly become accustomed to recognized expected responses and will readily be able to identify line anomalies. The line signatures for wire pairs can also be compared to line signatures obtained at different time intervals to detect changes that occur over time. Also, standard lines such a phone lines can be compared to stored reference signatures obtained from a similar standard type line to detect the presence of additional unexpected electronics or taps.

A mathematical approach can also be taken to comparing the line signatures compared graphically in FIG. 2. The mathematical approach generates mathematical methods of the line signature data for comparison. One method is to generate polynomial equations to represent each line signature curve. Software can then simply compare the terms of the polynomial equations as one method of mathematical comparison. For example: if you generate an equation of the form: $y=a_0+a_1x+a_2x^2+a_3x^3\ldots$ that corresponds to a line signature graph, then the polynomial coefficients provide some direct information for automated comparison. For example, the coefficient $a_1$ represents the linear slope of the line signature. Thus, one simple method of comparison is to simply compare the $a_1$ coefficient values from two different pairs. Different coefficients in the equation provide further information concerning the differences in the responses of the detected taps. As just one example, comparing $a_1$ coefficients removes any attenuation that is due to different line lengths in a comparison.

While FIG. 2 shows line signatures created by measuring the line's response to a series of non-linear junction detection signals, an embodiment of the present invention can utilize a single detection signals to obtain a single response for each line. This response can then be compared to responses from similarly situated lines, or a reading taken from the same line at a different time, to identify any anomalies that may be indicative of surreptitious electronics or line configuration changes. The number of test signals utilized depends upon the required sensitivity of the test and the anomalies the test is attempting to locate. While more data points add more information and detail to the results, they require additional testing time and effort.

Figure 3:
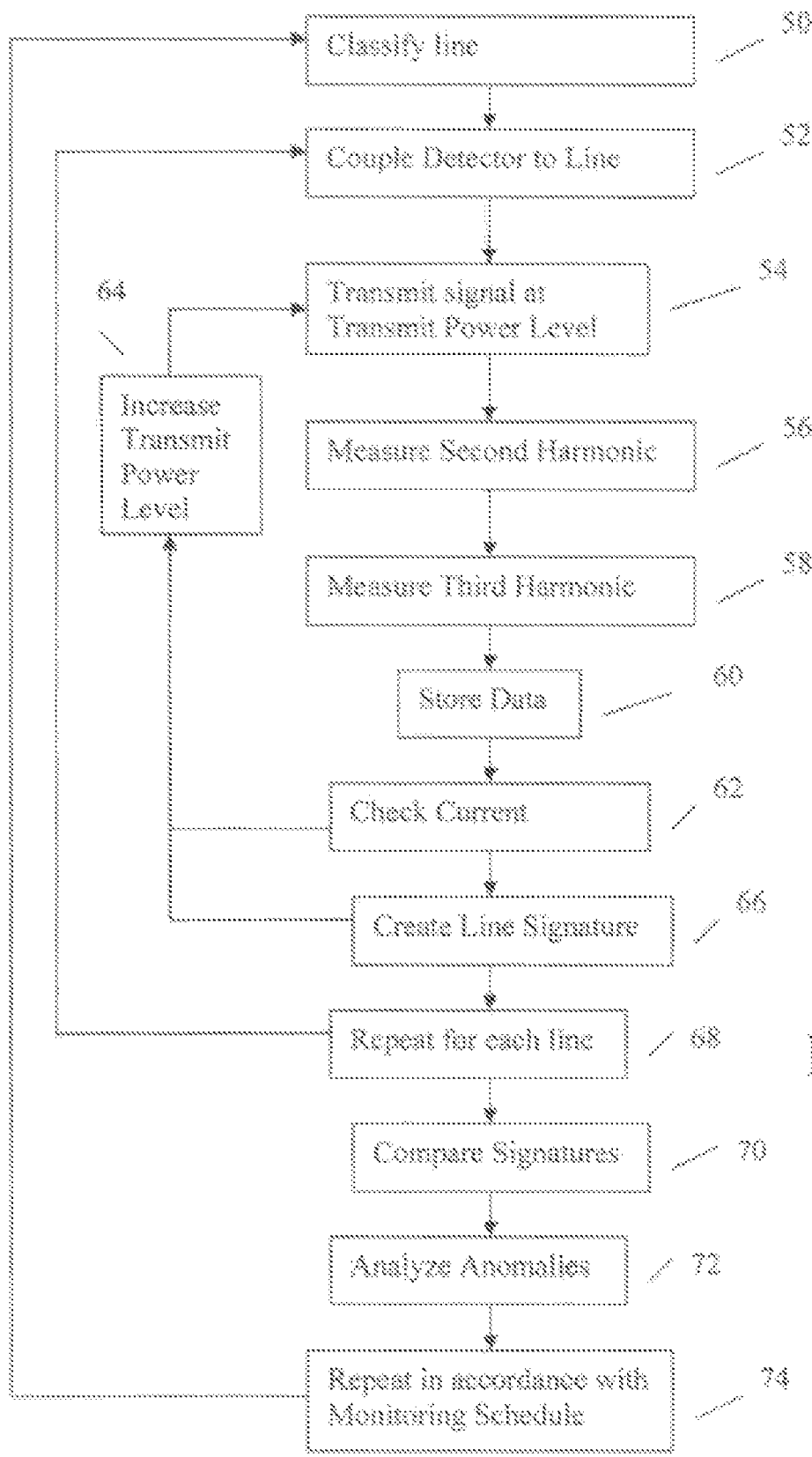
FIG. 3 is a flow chart of a method of detecting line anomalies in accordance with an embodiment of the present invention.

Referring now to FIG. 3, a flow chart of a preferred method of detecting line anomalies in accordance with an embodiment of the present invention is shown. The method begins in step 50 with the classifying of the line as being active, inactive, having a particular configuration, etc. The actual classifications used will depend upon the type of lines being evaluated and which of the lines would be expected to produce similar responses due to the similar configurations. In step 52, a detector constructed as described herein is coupled to the classified line. A signal is transmitted at a transmit power level on the line in step 54. The transmit signal may include a bias voltage as discussed herein. In step 56, a 2nd harmonic response to the transmitted signal is measured. A 3rd harmonic response is measured in step 58. The data is stored for later reference in step 60. In step 62, the AC current delivered to line by the transmit signal is checked to determine if it exceeded an allowable threshold. This allows the process to be undertaken without disconnecting electronics coupled to line or creating a significant risk of damaging the electronics with the transmit signal. If the AC current is within an acceptable range the method proceeds to step 64 wherein the transmit power level of the signal is increased and steps 54 through 62 repeated. When the current exceeds the specified allowable current in step 62 or the test parameters, the method proceeds to step 66 wherein a line signature for the line is created based upon the stored data. In step 68, the process is repeated for each line in an analysis group. The line signatures from similarly classified lines are compared in step 70 to locate anomalies that are analyzed in step 72. The line responses may be compared graphically or mathematically as described herein. The entire process can be repeated in step 74 over a selected time interval so that changes in a line's configuration over time can be detected. Any lines having unexplained anomalies can be more thoroughly inspected to determine the cause of the anomaly.

Although there have been described particular embodiments of the present invention of a new and useful system for NON-LINEAR JUNCTION BASED ELECTRONICS DETECTION herein. It is not intended that such references be construed as limitations upon the scope of this invention except as set forth in the following claims.

What is claimed is:

1. A method for identifying harmonic producing line anomalies on a line under test, said method comprising the steps of:
   generating a first test signal at a first power level and coupling said first test signal to said line under test;
   receiving a response level from said line under test at a harmonic frequency of said first test signal; and
   comparing said response level to a stored harmonic response level to identify said harmonic producing line anomalies.

2. The method of claim 1 further comprising the steps of:
   generating a second test signal at a second power level and coupling said second test signal to said line under test;
   receiving a second response level from said line under test at a harmonic frequency of said second test signal; and
   creating a harmonic line signature based upon said first and second response levels.

3. The method of claim 1 wherein said stored harmonic response level represents harmonic response data from a line having a configuration similar to said line under test.

4. The method of claim 1 wherein the step of receiving a response level further comprises the step of receiving a response level at a second harmonic frequency of said test signal.

5. The method of claim 2 further comprising the step of measuring an AC current level supplied to said line by at least one of said first and second test signal and limiting the test signal power if said AC current level exceeds a threshold level.

6. The method of claim 1 wherein said line is a wire pair in a multiple wire pair cable further comprising the step of comparing said response level at said harmonic frequency to harmonic response levels from pairs within said multiple wire pair cable to locate said line anomalies.

7. The method of claim 1 further comprising comparing said response level to a response level obtained for said line under test at a different time to identify line configuration changes.

8. The method of claim 1 further comprising comparing a response level for a selected line pair in one cable to a corresponding pair in a different cable.

9. The method of claim 1 further comprising the step of generating a graphical representation of said response levels.

10. The method of claim 9 further comprising the step of performing a mathematical analysis of said graphical representation to generate mathematical equations corresponding to said graphical representation.

11. The method of claim 2 further comprising the step of performing a mathematical comparison between said harmonic line signature and a stored harmonic line signature.

12. The method of claim 11 further comprising the step of compensating for length differences in lines when comparing harmonic line signatures for different length cables.

13. A method of detecting harmonic producing line anomalies, said method comprising:
   applying a test signal to a line being tested;
   measuring a line response to said test signal at a harmonic frequency of said test signal;
   creating harmonic line response data based upon said line's response to said test signal at said harmonic frequency of said test signal; and
   comparing said harmonic line response data to stored harmonic line response data to locate said harmonic producing line anomalies.

14. The method of claim 13 wherein applying a test signal further comprises applying a series of two or more increased power level test signals until a current supplied to said line by said test signal exceeds a current threshold.

15. The method of claim 13 further comprising the step of comparing said harmonic line response data to harmonic line response data from a similarly classified line.

16. The method of claim 13 further comprising the step of comparing said harmonic line response data to harmonic line response data collected from said line at a previous time.

17. A device including circuitry and software for detecting harmonic response generating line anomalies, said device comprising:
   a signal generator for producing a test signal having a selected frequency content and power level;
   a coupler for coupling said test signal to a line being tested;
   a receiver that receives a line response to a test signal coupled to said line under test at a harmonic frequency of said test signal and produces harmonic line response data; and
   a display that simultaneously displays a graphical representation of said harmonic line response data and stored harmonic line response data such that said harmonic response generating line anomalies can be identified.

18. The device of claim 17 further comprising bias circuitry for generating a bias voltage that is applied to said line being tested.

19. The device of claim 18 wherein said bias circuitry further comprises circuitry for generating an AC bias voltage.

20. The device of claim 17 further comprising software for mathematically comparing said harmonic line response data.

21. The device of claim 17 further comprising a controller for instructing said signal generator to generate signals having at least two different power levels and said receiver to store harmonic line response data at each power level.

22. The device of claim 17 further comprising current detection circuitry for detecting an amount of current supplied to said line being tested by said test signal.

* * * * *